(12) United States Patent
Wang et al.

(10) Patent No.: US 11,465,904 B2
(45) Date of Patent: *Oct. 11, 2022

(54) METHOD FOR MAKING CARBON NANOTUBES

(71) Applicants: Tsinghua University, Beijing (CN); HON HAI PRECISION INDUSTRY CO., LTD., New Taipei (TW)

(72) Inventors: Jiang-Tao Wang, Beijing (CN); Peng Liu, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 300 days.

This patent is subject to a terminal disclaimer.

(21) Appl. No.: 16/839,328

(22) Filed: Apr. 3, 2020

(65) Prior Publication Data
US 2020/0231442 A1    Jul. 23, 2020

Related U.S. Application Data

(63) Continuation of application No. 15/979,423, filed on May 14, 2018, now Pat. No. 10,676,359.

(30) Foreign Application Priority Data

May 17, 2017  (CN) .......................... 201710349116.X

(51) Int. Cl.
  *C01B 32/162*    (2017.01)
  *C01B 32/159*    (2017.01)
  (Continued)

(52) U.S. Cl.
  CPC .......... *C01B 32/162* (2017.08); *C01B 32/159* (2017.08); *C01B 32/16* (2017.08); *B82Y 30/00* (2013.01); *B82Y 40/00* (2013.01); *C01B 2202/02* (2013.01); *H01L 51/0048* (2013.01); *H01L 51/0558* (2013.01)

(58) Field of Classification Search
  None
  See application file for complete search history.

(56) References Cited

U.S. PATENT DOCUMENTS

| | | | |
|---|---|---|---|
| 7,084,507 B2 * | 8/2006 | Awano | H01L 21/28562 257/E21.582 |
| 10,676,359 B2 * | 6/2020 | Wang | C01B 32/159 |

* cited by examiner

*Primary Examiner* — Guinever S Gregorio
(74) *Attorney, Agent, or Firm* — ScienBiziP, P.C.

(57) ABSTRACT

A method of making carbon nanotubes is provided, the method includes depositing a catalyst layer on a substrate, placing the substrate having the catalyst layer in a reaction furnace, heating the reaction furnace to a predetermined temperature, introducing a carbon source gas and a protective gas into the reaction furnace to grow a first carbon nanotube segment structure comprising a plurality of metallic carbon nanotube segments, and applying a pulsed electric field to grow a second carbon nanotube segment structure from the plurality of metallic carbon nanotube segments, where the pulsed electric field is a periodic electric field including a plurality of positive electric field pulses and a plurality of negative electric field pulses alternately arranged, and the second carbon nanotube segment structure includes a plurality of semiconducting carbon nanotube segments.

11 Claims, 24 Drawing Sheets

(51) Int. Cl.
*C01B 32/16* (2017.01)
*B82Y 30/00* (2011.01)
*H01L 51/00* (2006.01)
*B82Y 40/00* (2011.01)
*H01L 51/05* (2006.01)

METHOD FOR MAKING CARBON NANOTUBES

CROSS-REFERENCE TO RELATED APPLICATIONS

This application is a continuation application of U.S. patent application Ser. No. 15/979,423, filed on May 14, 2018, entitled, "METHOD FOR MAKING CARBON NANOTUBES", which claims all benefits accruing under 35 U.S.C. § 119 from China Patent Application No. 201710349116.X, filed on May 17, 2017, in the China National Intellectual Property Administration, the contents of which are hereby incorporated by reference. The disclosures of the above-identified applications are incorporated herein by reference.

FIELD

The subject matter herein generally relates to a method for making carbon nanotubes.

BACKGROUND

Carbon nanotubes have excellent properties such as electrical properties, high Young's modulus and tensile strength, and high thermal conductivity.

In carbon nanotubes prepared by the conventional chemical vapor deposition (CVD) method, the proportion of metallic carbon nanotubes (m-CNTs) and semiconducting carbon nanotubes (s-CNTs) is typically about 1:2.

It has been impossible to directly grow s-CNTs with higher purity. Meanwhile, the chirality of carbon nanotubes cannot be arbitrarily changed during growth, in the prior art. Semiconducting carbon nanotube segments and metallic carbon nanotube segments cannot be alternately formed during growth according to need. Thus, carbon nanotubes with alternating semiconducting carbon nanotube segments and metallic carbon nanotube segments have not been available for carbon nanotube structures or in the application of carbon nanotube structures, such as thin film transistors, light detectors, and photoelectric conversion modules.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views. Implementations of the present technology will be described, by way of example only, with reference to the attached figures

DETAILED DESCRIPTION

Figure 1:
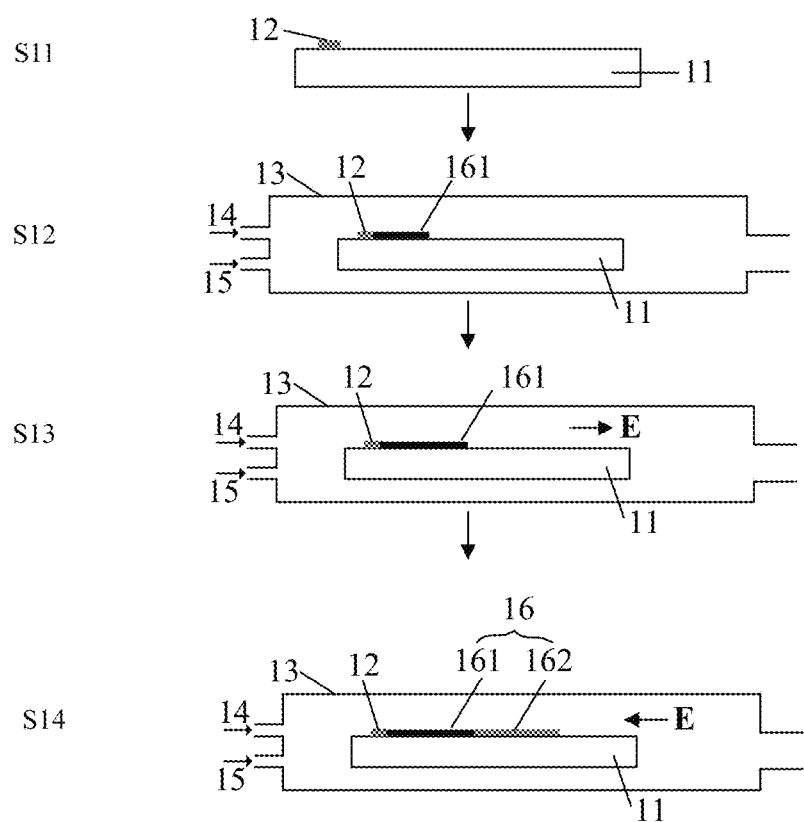
FIG. 1 is a flow chart of an embodiment of a method for making carbon nanotubes.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to better illustrate details and features. The description is not to be considered as limiting the scope of the embodiments described herein.

Several definitions that apply throughout this disclosure will now be presented.

The connection can be such that the objects are permanently connected or releasably connected. The term "substantially" is defined to be essentially conforming to the particular dimension, shape, or other feature that the term modifies, such that the component need not be exact. The term "comprising" means "including, but not necessarily limited to"; it specifically indicates open-ended inclusion or membership in a so-described combination, group, series, and the like. It should be noted that references to "an" or "one" embodiment in this disclosure are not necessarily to the same embodiment, and such references mean "at least one."

In FIG. 1, an embodiment of a method of making carbon nanotubes comprises:

S11, depositing a catalyst layer 12 on a substrate 11;

S12, placing the substrate 11 having the deposited catalyst layer 12 in a reaction furnace 13, then heating the reaction furnace 13 to obtain a predetermined temperature, introducing a carbon source gas 14 and a protective gas 15 into the reaction furnace 13 to grow a first carbon nanotube structure 161, where the first carbon nanotube structure 161 includes a plurality of carbon nanotube segments;

S13, applying an electric field to the first carbon nanotube structure 161, where a direction of the electric field is the direction in which the catalyst layer 12 is positively charged; and S14, reversing the direction of the electric field to grow a second carbon nanotube structure 162 from the first carbon nanotube structure 161, where the first carbon nanotube structure 161 and the second carbon nanotube structure 162 form a carbon nanotube structure 16, and the second carbon nanotube structure 162 includes a plurality of semiconducting carbon nanotube segments.

In step S11, carbon nanotubes are grown on the substrate 11. The material of the substrate 11 can be silicon, glass, quartz, or the like. In an embodiment, the substrate 11 is ST-cut single crystal quartz substrate.

The catalyst layer 12 can be a catalyst powder layer. The material of the catalyst layer 12 can be any catalyst material sufficient to grow single-walled carbon nanotubes. The catalyst layer 12 can be an iron powder layer, an iron film, a nickel powder layer, a nickel mesh, or a mixture layer of alumina powder and iron powder. A method of forming the catalyst layer 12 on the substrate 11 can be electron beam deposition, vapor deposition, sputtering, or spraying. In an embodiment, the catalyst layer 12 is an iron powder layer with a particle diameter of 0.2 nanometers, the catalyst layer 12 is deposited on the substrate 11 by electron beam deposition.

In step S12, the substrate 11 having the deposited catalyst layer 12 is placed in the reaction furnace 13. The predetermined temperature is in a range of 800 degrees Celsius to 960 degrees Celsius. The predetermined temperature can be in a range of 900 degrees Celsius to 950 degrees Celsius. In an embodiment, the predetermined temperature is 950 degrees Celsius.

The carbon source gas 14 can be carbon monoxide, or hydrocarbon such as acetylene, methane, ethane, or ethylene, or vapor containing carbon atoms, like ethanol. The protective gas 15 can be hydrogen gas, nitrogen gas, or another inert gas. Flow ratios of the carbon source gas 14 and the protective gas 15 can be adjusted according to the type and requirement of the carbon source gas. In an embodiment, the carbon source gas 14 is methane, and the protective gas 15 is hydrogen gas. The $H_2$ with a flow rate of 500 sccm and $CH_4$ with a flow rate of 200 sccm are introduced into the reaction furnace 13 for ten minutes, then the $H_2$ with a flow rate of 5 sccm and $CH_4$ with a flow rate of 2 sccm are introduced into the reaction furnace 13 to grow the first carbon nanotube structure 161.

The method of growing the first carbon nanotube structure 161 is not limited to the growth method in steps S11-S12 described above, the method can be arc discharge method or laser ablation method. The first carbon nanotube structure 161 includes a plurality of carbon nanotube segments. The plurality of carbon nanotube segments is arranged in an array, and the plurality of carbon nanotube segments substantially extends along a same direction. The quantity density of the carbon nanotube segments in the first carbon nanotube structure 161 is greater than 3/μm to ensure that the chirality of carbon nanotube segments can be effectively controlled by the electric field in the growth process of the carbon nanotube segments. The term "quantity density" refers to the number of carbon nanotube segments per micron along a direction which is perpendicular to the growth direction of the carbon nanotube segments. In an embodiment, the carbon nanotube segments are arranged in a horizontal array, and the quantity density of the carbon nanotube segments is greater than 6/μm. The growth process of the plurality of carbon nanotube segments can be bottom growth, or top growth. When the growth process of the plurality of carbon nanotube segments is bottom growth, the catalyst layer 12 is adhered to a surface of the substrate 11, and the carbon nanotube segments start growing from a surface of the catalyst layer 12 and grow away from the catalyst layer 12. When the growth process of the plurality of carbon nanotube segments is top growth, the carbon nanotube segments start growing from the surface of the catalyst layer 12 and grow with the catalyst layer 12. The first carbon nanotube structure 161 includes a plurality of metallic carbon nanotube segments. The carbon nanotube segments of the first carbon nanotube structure 161 are single-walled carbon nanotubes. A diameter of a single-walled carbon nanotube is less than 2 nanometers. The diameter of the single-walled carbon nanotube can be in a range of 1.2 nanometers to 1.5 nanometers. In an embodiment, the first carbon nanotube structure 161 includes both semiconducting carbon nanotube segments and metallic carbon nanotube segments, and the ratio of the semiconducting carbon nanotube segments and the metallic carbon nanotube segments is about or less than 2:1.

Figure 2:
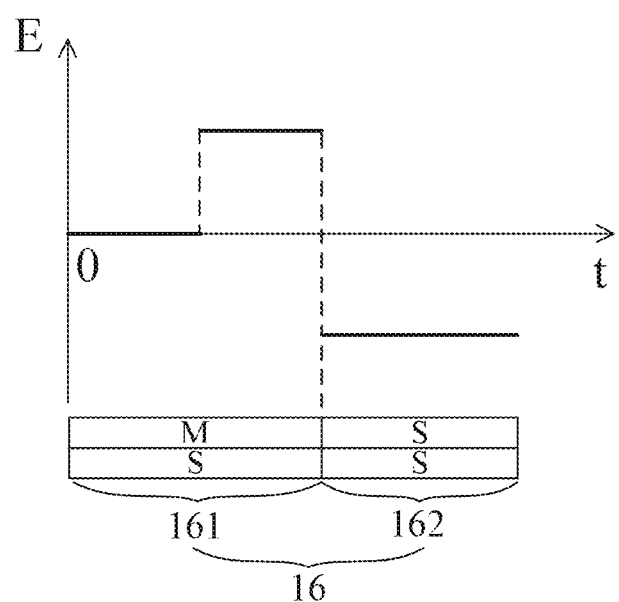
FIG. 2 is a schematic view of an embodiment of an electric field to control the chirality of carbon nanotubes.
Figure 3:
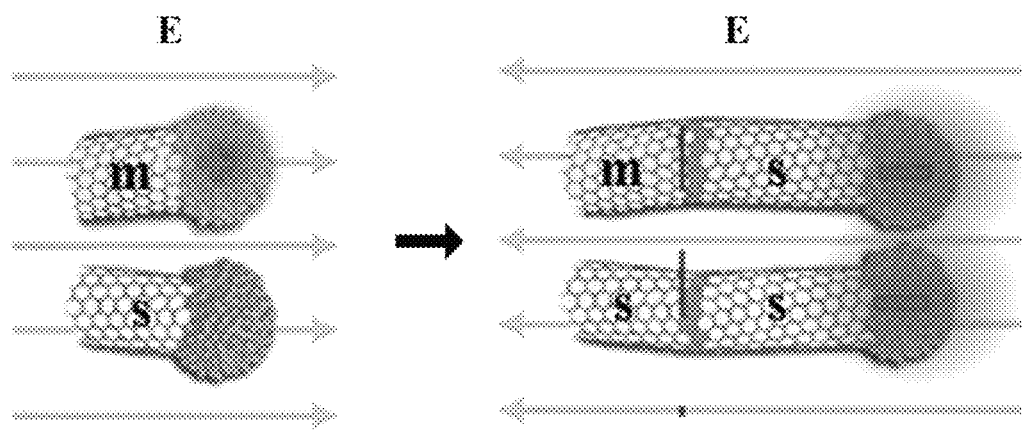
FIG. 3 is a schematic view of an embodiment of controlling the chirality of carbon nanotubes using an electric field.

In step S13, the electric field applied to the carbon nanotube structure 16 can be a direct current (DC) electric field or a pulsed electric field. In FIG. 2, a direction of the electric field is set to a positive direction when the catalyst layer 12 is positively charged. A direction of the electric field is set to a negative direction when the catalyst layer 12 is negatively charged. The positive direction can be reversed to the negative direction. In FIG. 3, "s" refers to semiconducting, "m" refers to metallic, and "E" refers to the applied electric field. In an embodiment, the electric field is the DC electric field. When a positive electric field is first applied to the first carbon nanotube structure 161, the growth of the first carbon nanotube structure 161 is not affected and the chirality of the carbon nanotube segments in the first carbon nanotube structure 161 remains unchanged. Thus, the metallic carbon nanotube segments remain as pure metallic carbon nanotube segments before and after applying the positive electric field, and the semiconducting carbon nanotube segments remain as pure semiconducting carbon nanotube segments before and after applying the positive electric field.

In step S14, the positive electric field is reversed to a negative electric field. Such change from the positive electric field to the negative electric field causes the chirality of the grown carbon nanotube segments to change. When an electric field direction changes from the positive direction to the negative direction, the carbon nanotube segments of the second carbon nanotube structure 162 are mostly semiconducting carbon nanotube segments. The second carbon nanotube structure 162, grown from the semiconducting carbon nanotube segments of the first carbon nanotube structure 161, are semiconducting carbon nanotube segments. The carbon nanotube segments of the second carbon nanotube structure 162, that are grown from the metallic carbon nanotube segments of the first carbon nanotube structure 161, are also semiconducting carbon nanotube segments.

The second carbon nanotube structure 162 can become pure semiconducting carbon nanotube segments by applying an inverted electric field. The change of the electric field direction from positive to negative increases negative charges, which increases the Fermi level of the catalyst layer 12. The higher the Fermi level, the easier is the transition from metallic carbon nanotube segments to semiconducting carbon nanotube segments. In an embodiment, a raised value of the Fermi level of the catalyst layer 12 is greater than or equal to 0.7 eV. In an embodiment, the raised value of the Fermi level of the catalyst layer 12 is 1 eV.

Figure 4:
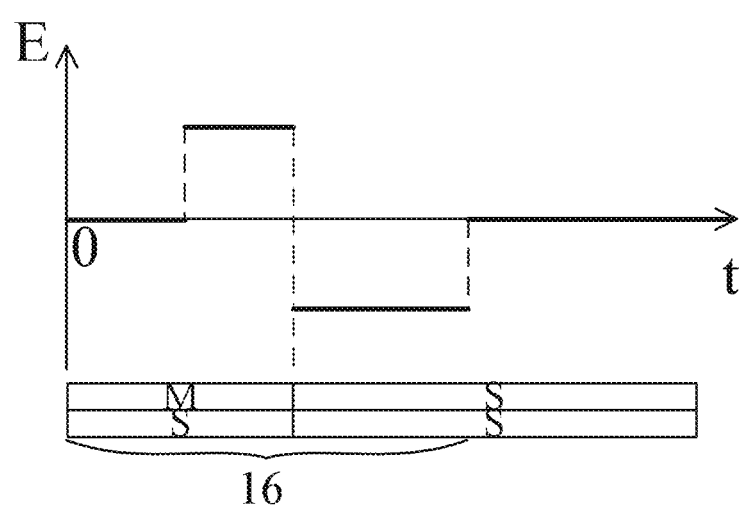
FIG. 4 is a schematic view of an embodiment of carbon nanotubes with chirality after removing the electric field.
Figure 5:
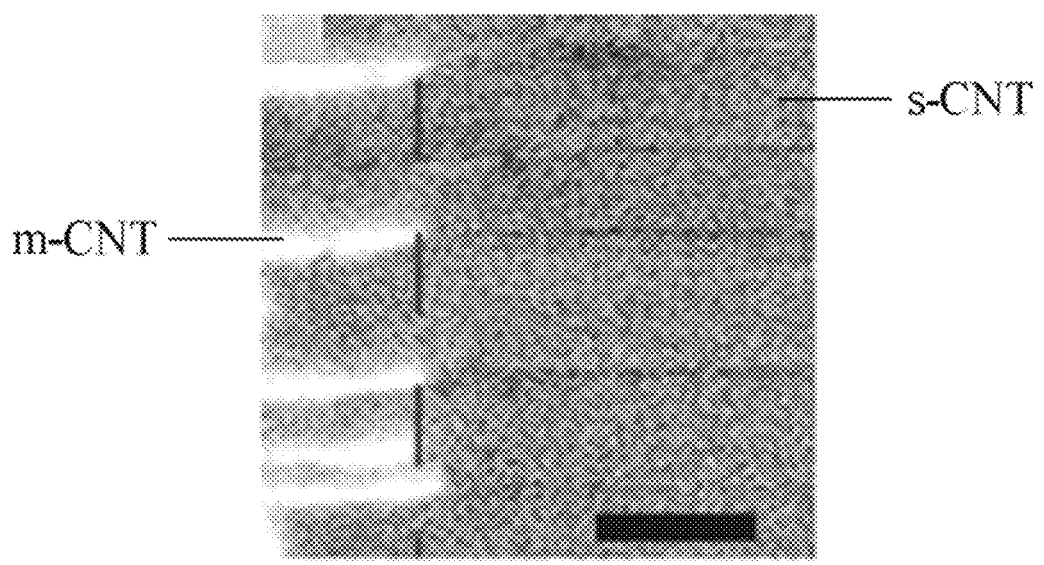
FIG. 5 is a Scanning Electron Microscope (SEM) image of carbon nanotubes before and after applying a reverse electric field.

When the positive electric field is originally applied to the first carbon nanotube structure 161, an application time of the positive electric field must not be too short, the carbon nanotube segments must have enough time inside a positive electric field environment. In an embodiment, the application time of the positive electric field is greater than or equal to 2 seconds, and the electric field intensity of the positive electric field is greater than or equal to 200 volts per millimeter (v/mm). When the positive electric field is reversed, the electric field environment of the carbon nanotube segments changes violently, which directly affects the chirality of the carbon nanotube segments. Gibbs free energy for growing semiconducting carbon nanotubes is less than Gibbs free energy for growing metallic carbon nanotubes after the catalyst layer 12 is negatively charged. When the electric field reverses from positive to negative, the second carbon nanotube structure 162 mostly comprises semiconducting carbon nanotube segments. The proportion of semiconducting carbon nanotube segments in the second carbon nanotube structure 162 is related to an application time of the negative electric field. The application time of the negative electric field depends on the area of electrodes. The larger the area of electrodes, the longer the application time of the negative electric field. For example, when the area of electrodes is very small (4 mm×8 mm), the carbon nanotube segments can become completely semiconducting carbon nanotube segments with the application time of the negative electric field being 100 ms; when the area of electrodes is very large (4 cm×4 cm), the carbon nanotube segments can become completely semiconducting carbon nanotube segments with the application time of the negative electric field being 500 ms, the carbon nanotube segments can become completely semiconducting carbon nanotube segments when the application time of the negative electric field is in a range of 100 ms to 500 ms. In an embodiment, the area of electrodes is 5 mm×2 cm, and the electrodes are used in the following. When the application time of the negative electric field is less than 200 ms, only part of the carbon nanotube segments of the second carbon nanotube structure 162 are semiconducting carbon nanotube segments. If the application time of the negative electric field is too short, other part of the carbon nanotube segments of the second carbon nanotube structure 162 remains metallic carbon nanotube segments. When the application time of the negative electric field is greater than 200 ms, all the carbon nanotube segments of the second carbon nanotube structure 162 become semiconducting carbon nanotube segments. In FIG. 4, when all the carbon nanotube segments of the second carbon nanotube structure 162 are semiconducting carbon nanotube segments, the growth of the carbon nanotube structure 16 is not affected by the negative electric field. After removing the negative electric field, the chirality of new carbon nanotube segments grown from the carbon nanotube structure 16 will remain unchanged. In FIG. 5 is an SEM image of carbon nanotubes before and after applying the reverse electric field. The white strips are metallic carbon nanotube segments, the dark strips are semiconducting carbon nanotube segments. In an embodiment, the application time of the positive electric field is 20 seconds, the electric field intensity of the positive electric field is 200 v/mm, the application time of the negative electric field is 500 milliseconds, and the electric field intensity of the negative electric field is −200 v/mm.

Figure 6:
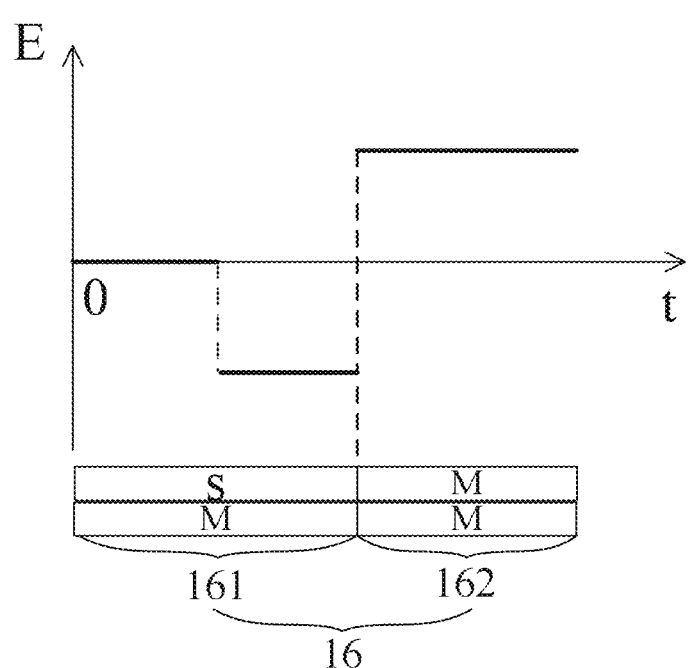
FIG. 6 is a schematic view of an embodiment of controlling the formation of carbon nanotubes with chirality using an electric field.
Figure 7:
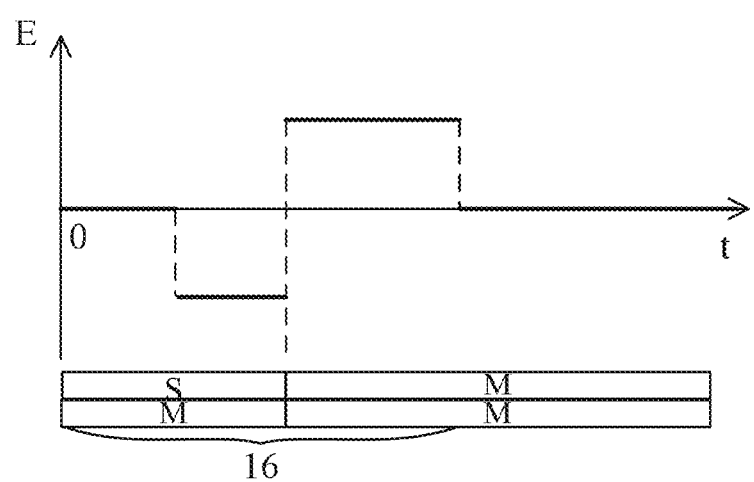
FIG. 7 is a schematic view of an embodiment of the chirality of carbon nanotubes after removing the electric field.

Alternatively, in FIG. 6, when the electric field direction changes from negative to positive, the chirality of the carbon nanotube segments can also change during growth. When the negative electric field is first applied to the first carbon nanotube structure 161, the growth of the first carbon nanotube structure 161 is not affected and the chirality of the carbon nanotube segments in the first carbon nanotube structure 161 remains unchanged. When the electric field direction changes from negative to positive, the second carbon nanotube structure 162 are mostly metallic carbon nanotube segments. The second carbon nanotube structure 162, grown from the metallic carbon nanotube segments of the first carbon nanotube structure 161, are metallic carbon nanotube segments. The second carbon nanotube structure 162, grown from the semiconducting carbon nanotube segments of the first carbon nanotube structure 161, are also metallic carbon nanotube segments. The change of the electric field direction from negative to positive increases positive charges, which can reduce the Fermi level of the catalyst layer. The lower the Fermi level, the easier is the transition from semiconducting carbon nanotube segments to metallic carbon nanotube segments. In an embodiment, the reduced value of the Fermi level of the catalyst layer 12 is less than or equal to −0.1 eV. In an embodiment, the reduced value of the Fermi level of the catalyst layer 12 is less than or equal to −0.2 eV. In FIG. 7, when all the carbon nanotube segments of the second carbon nanotube structure 162 are metallic carbon nanotube segments, the growth of the carbon nanotube structure 16 is not affected by the positive electric field. After removing the positive electric field, the chirality of new carbon nanotube segments grown from the carbon nanotube structure 16 remains unchanged.

Figure 8:
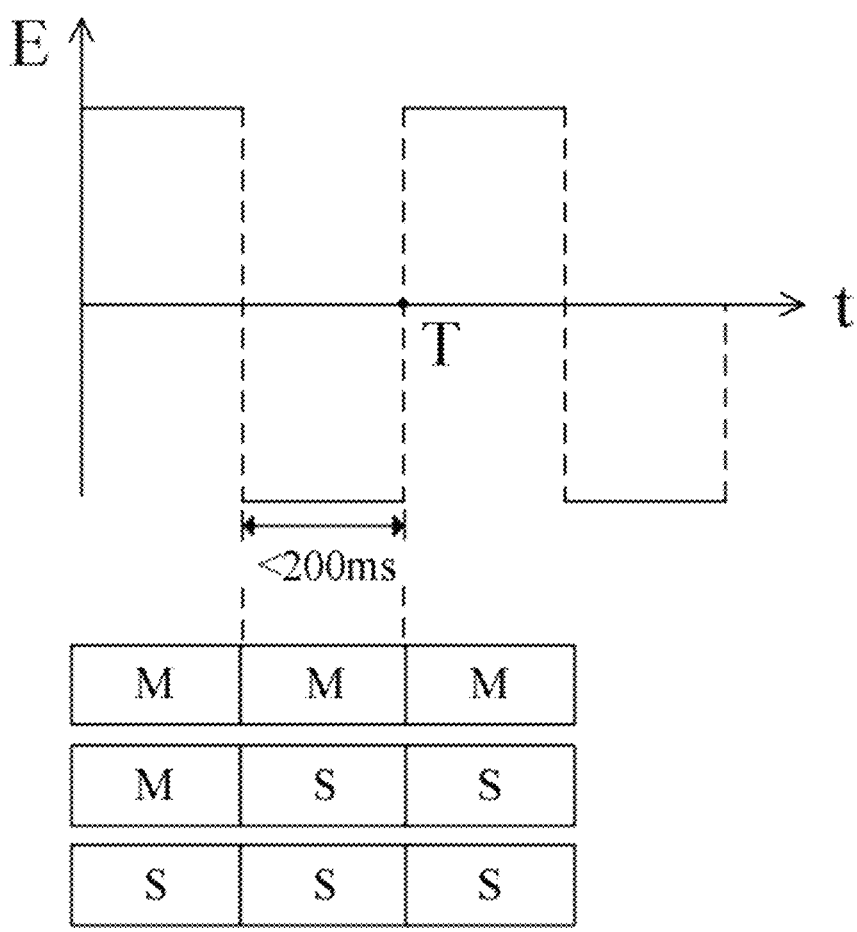
FIG. 8 is a schematic view of an embodiment of a pulsed electric field voltage changing with time.

Furthermore, applying a pulsed electric field to the first carbon nanotube structure 161 can change the chirality to an alternating chirality. In FIG. 8, the pulsed electric field is a periodic electric field formed by a positive electric field pulse followed by a negative electric field pulse. A period T of the pulsed electric field is a sum of a pulse width of one positive electric field pulse and a pulse width of one negative electric field pulse. The chirality of the carbon nanotube segments in the carbon nanotube structure 16 can be controlled by adjusting the pulse width of the negative electric field pulse and the electric field direction.

In FIG. 8, when the pulse width of the negative electric field pulse is less than 200 milliseconds, and the electric field direction changes from positive to negative, only part of the carbon nanotube segments of the second carbon nanotube structure 162 are semiconducting carbon nanotube segments. The change in the field direction (from negative to positive), does not change the chirality of the carbon nanotube segments of the second carbon nanotube structure 162.

Figure 9:
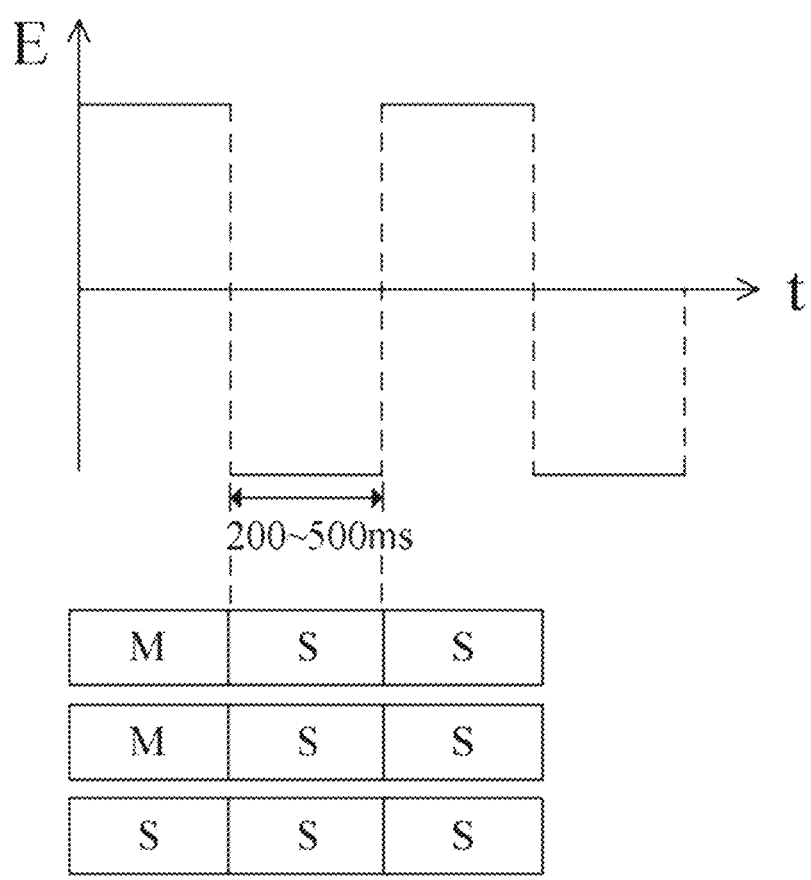
FIG. 9 is a schematic view of an embodiment of a chiral change of carbon nanotubes in a pulsed electric field when a pulse width is less than 500 ms.

In FIG. 9, when the pulse width of the negative electric field pulse is greater than 200 milliseconds and less than or equal to 500 milliseconds, and the electric field direction changes from positive to negative, all the carbon nanotube segments of the second carbon nanotube structure 162 are semiconducting carbon nanotube segments. The change in the field direction (from negative to positive), does not change the chirality of the carbon nanotube segments of the second carbon nanotube structure 162.

Figure 10:
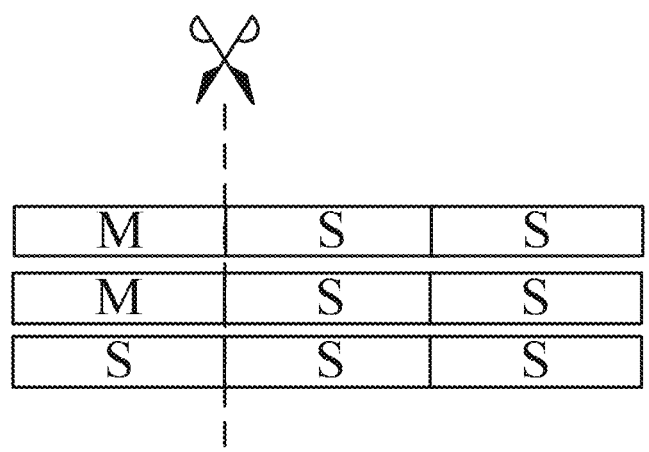
FIG. 10 is a schematic view of an embodiment of a method of removing a head portion of a carbon nanotube structure.

Furthermore, in FIG. 10, pure semiconducting carbon nanotubes can be obtained by removing the metallic carbon nanotube segments of the carbon nanotube structure 16, where the metallic carbon nanotube segments are in a head portion of the carbon nanotube structure 16.

Figure 11:
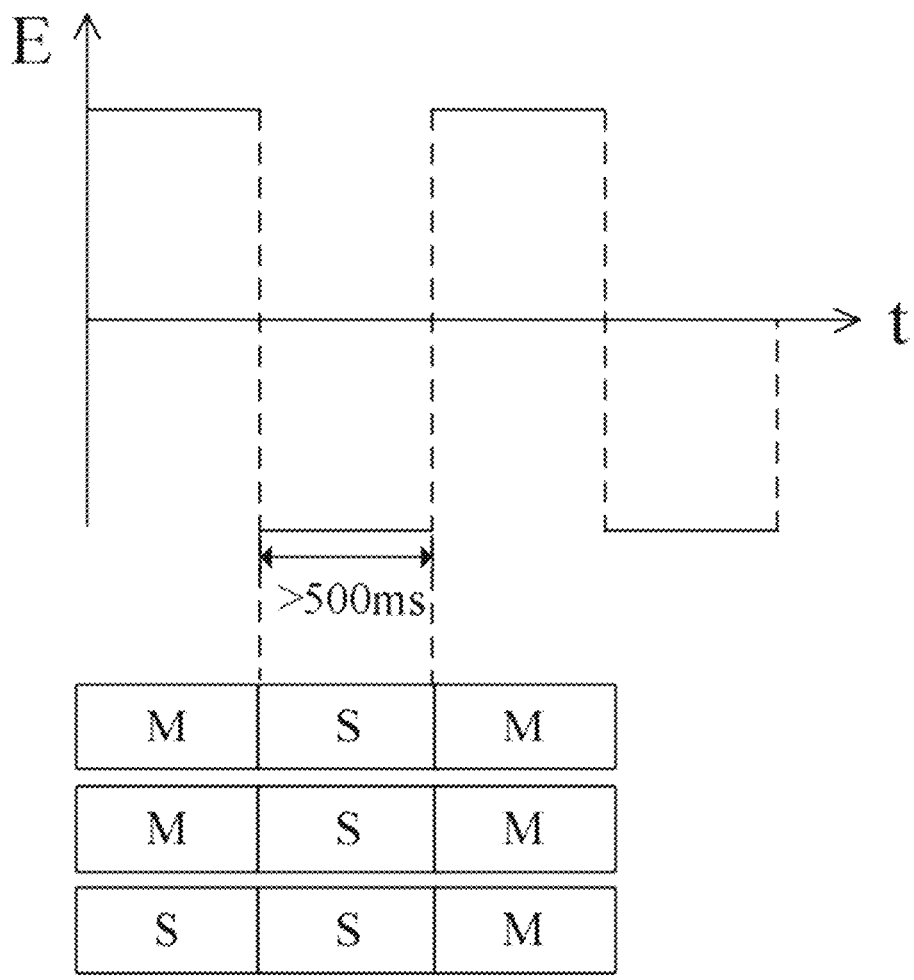
FIG. 11 is a schematic view of an embodiment of the chirality of carbon nanotubes changing with electric field when the pulse width is greater than 500 ms.

In FIG. 11, when the pulse width of the negative electric field pulse is greater than 500 milliseconds, and the electric field direction changes from positive to negative, all the carbon nanotube segments of the second carbon nanotube structure 162 are semiconducting carbon nanotube segments. When the electric field direction changes from negative to positive, the carbon nanotube segments of the second carbon nanotube structure 162 can become metallic carbon nanotube segments. When the pulse width of the negative electric field pulse is too long, the catalyst layer 12 can spontaneously discharge so that the negative charge decreases. Upon the electric field direction changing from negative to positive, the positive electric field pulse applied to the catalyst layer 12 is sufficient to change the chirality from semiconducting to metallic. When the pulse width of the negative electric field pulse is greater than 500 milliseconds, as the application time of the pulsed electric field increases, the chirality of carbon nanotube segments which are growing from the carbon nanotube structure 16 changes alternately.

Figure 12:
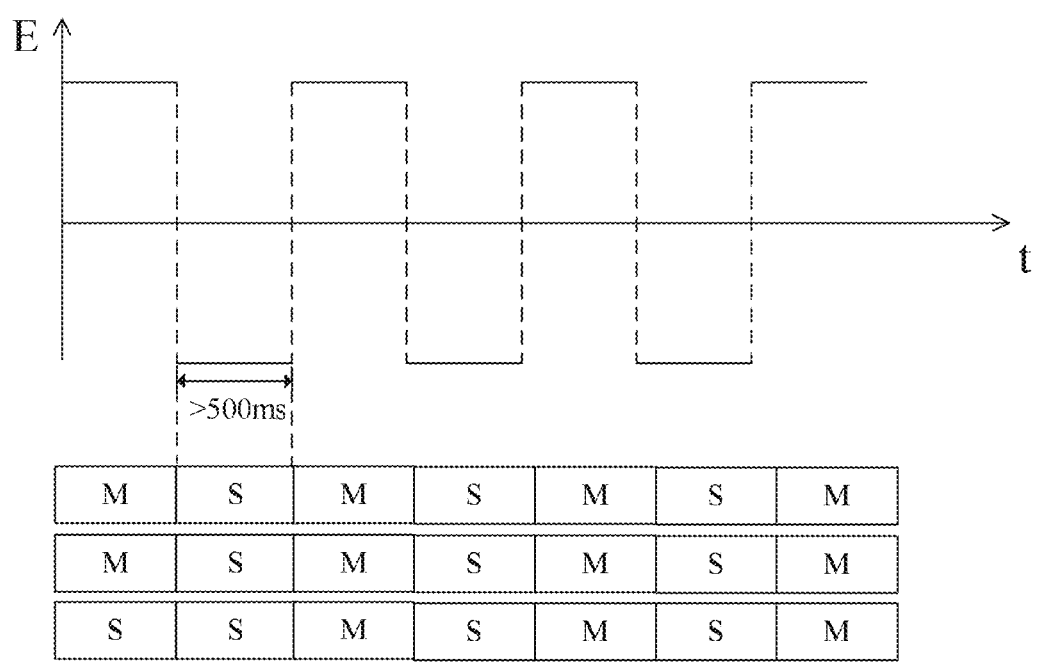
FIG. 12 is a schematic view of an embodiment of the chirality of new carbon nanotubes changing with a pulsed electric field.

In FIG. 12, as the period T increases, new carbon nanotube segments grown from the carbon nanotube structure 16 consist of alternating metallic carbon nanotube segments and semiconducting carbon nanotube segments.

Figure 13:
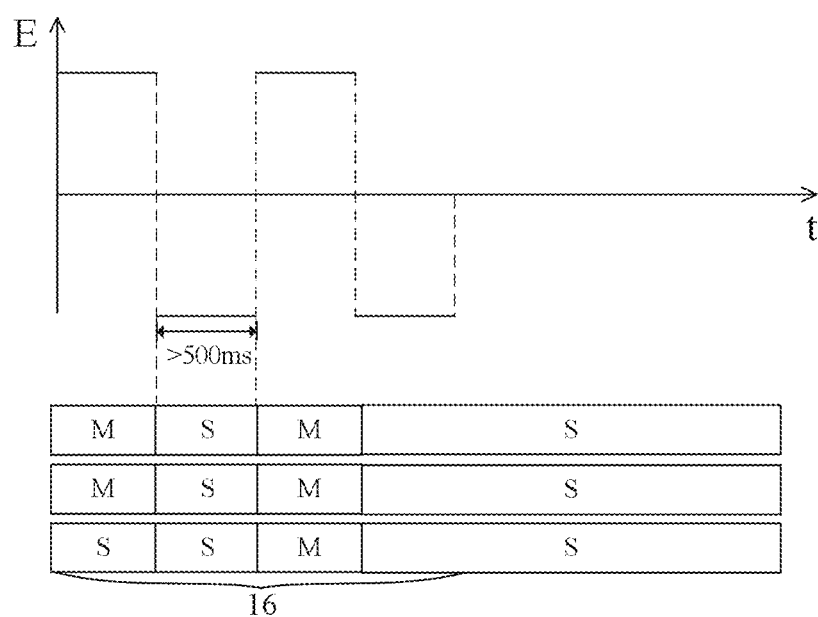
FIG. 13 is a schematic view of an embodiment of the chirality of new carbon nanotubes changing after removing the pulsed electric field.
Figure 14:
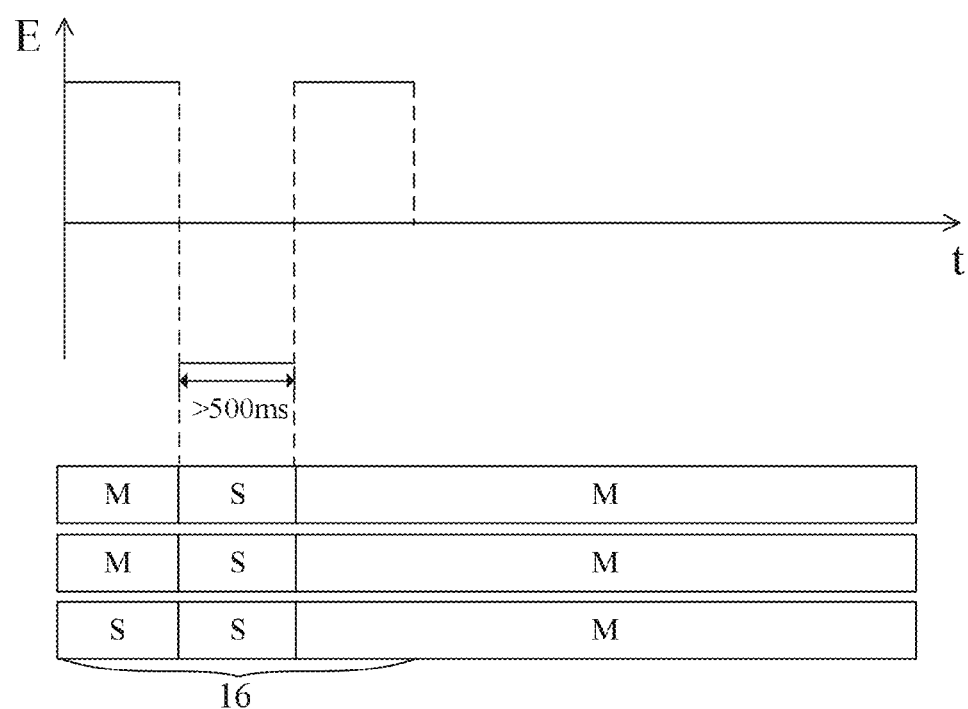
FIG. 14 is a schematic view of an embodiment of the chirality of new carbon nanotubes changing after removing the pulsed electric field.

Furthermore, in FIG. 13 and FIG. 14, after removing the pulsed electric field, the chirality of the new carbon nanotube segments remains unchanged. Pure metallic carbon nanotubes can be obtained by removing the head portion of the carbon nanotube structure 16.

Figure 15:
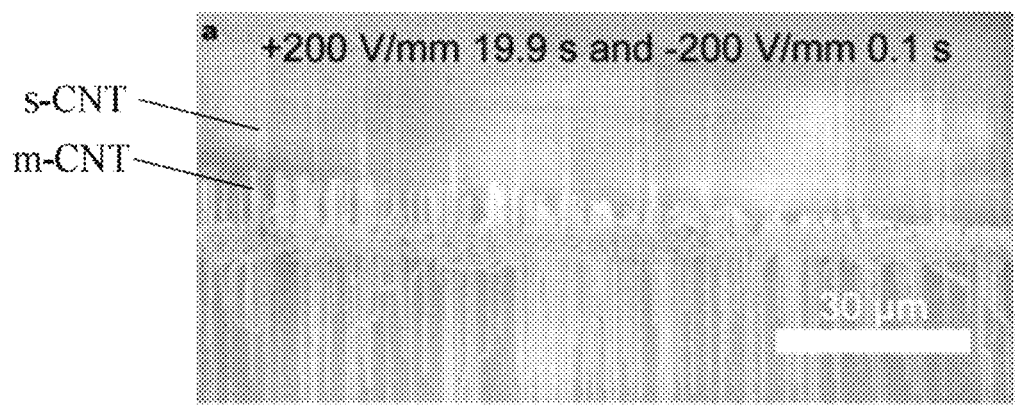
FIG. 15 is an SEM image of carbon nanotubes when the pulse width is 100 ms.

In FIG. 15, an SEM image of carbon nanotube structure is shown, where the period T of the pulsed electric field is 20 seconds, and the pulse width of the negative electric field pulse is 100 milliseconds. The bright white strips are metallic carbon nanotube segments, and the light white strips are semiconducting carbon nanotube segments.

Figure 16:
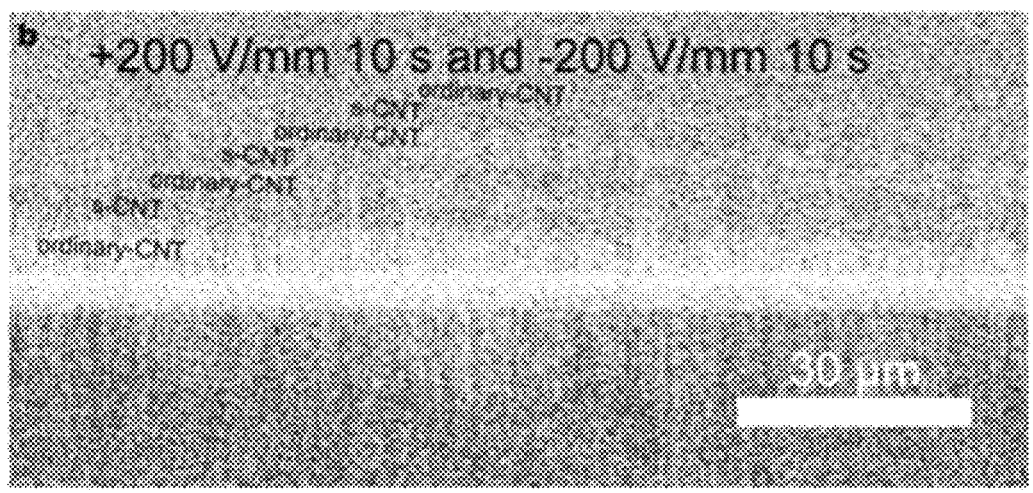
FIG. 16 is an SEM image of carbon nanotubes when the pulse width is 10 seconds.
Figure 17:
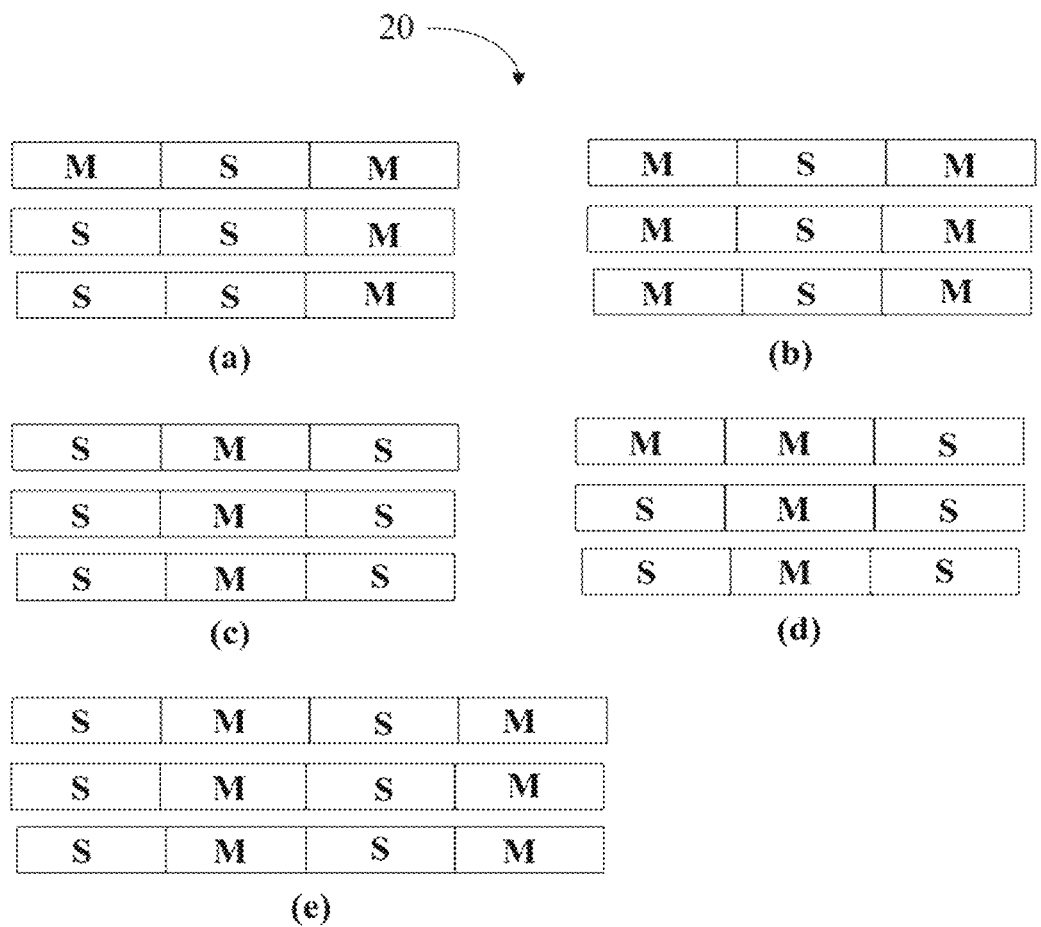
FIGS. 17(a)-(e) are structural schematic views of an embodiment of a carbon nanotube array.

In FIG. 16, an SEM image of carbon nanotube structure is shown, where the period T of the pulsed electric field is 20 seconds, and the pulse width of the negative electric field pulse is 10 seconds. The carbon nanotube structure is an array formed by a plurality of carbon nanotubes, where each of the carbon nanotubes is forming semiconducting carbon nanotube segments and metallic carbon nanotube segments on an alternating basis.

The method of making carbon nanotubes includes particular advantages. Firstly, the chirality of carbon nanotube segments grown from a carbon nanotube structure can be adjusted by applying an electric field which is reversible. Secondly, alternating semiconducting carbon nanotube segments and metallic carbon nanotube segments can be obtained by adjusting a pulse width of a negative electric field pulse and an electric field direction.

In FIGS. 17(a)-(e), an embodiment of a carbon nanotube array 20 made by the above method comprises a plurality of carbon nanotubes. Each of the carbon nanotubes includes at least one semiconducting carbon nanotube segment (S) and at least one metallic carbon nanotube segment (M). The plurality of carbon nanotubes is arranged to form an array. The semiconducting carbon nanotube segment (S) and the adjacent metallic carbon nanotube segment (M) are connected by the Schottky barrier.

The plurality of carbon nanotubes comprises semiconducting carbon nanotube segments and metallic carbon nanotube segments. Each of the carbon nanotubes can consist of only one semiconducting carbon nanotube segment and only one metallic carbon nanotube segment, and the semiconducting carbon nanotube segment and the metallic carbon nanotube segment are an integrated structure, and connected by the Schottky barrier. Each of the carbon nanotubes can also consist of a plurality of semiconducting carbon nanotube segments and a plurality of metallic carbon nanotube segments, and each of the semiconducting carbon nanotube segments and each of the metallic carbon nanotube segments are alternately arranged. The semiconducting carbon nanotube segments and the adjacent metallic carbon nanotube segments are connected by the Schottky barrier.

In FIGS. 17(a)-(e), in the carbon nanotube array 20, the structure of the carbon nanotubes can be M-S-M type carbon nanotubes, S-M-S type carbon nanotubes, or S-M type carbon nanotubes. In the plurality of carbon nanotubes, the lengths of the semiconducting carbon nanotube segments are substantially the same, and the lengths of the metallic carbon nanotube segments are substantially the same. The term "substantially" means that the lengths of the carbon nanotube segments may be slightly different in each carbon nanotube. In the actual production process, since the growth rate of each carbon nanotube is slightly different, the length of each carbon nanotube may be slightly different at the point when the direction of the electric field changes. The length of each semiconducting carbon nanotube segment or the length of each metallic carbon nanotube segment in the carbon nanotubes can be adjusted by changing the application time period of the electric field. The carbon nanotubes in the carbon nanotube array 20 are single-walled carbon nanotubes, and a diameter of the single-walled carbon nanotubes is less than 2 nanometers. Furthermore, the diameter of the single-walled carbon nanotubes is in a range of 1.2 nanometers to 1.5 nanometers. In an embodiment, each of the carbon nanotubes consists of a plurality of semiconducting carbon nanotube segments and a plurality of metallic carbon nanotube segments. The semiconducting carbon nanotube segments and the metallic carbon nanotube segments are alternately arranged, and the diameter of each of the carbon nanotubes is 1.3 nanometers.

The carbon nanotube array 20 has particular advantages. Each of the carbon nanotubes includes metallic carbon nanotube segments and semiconducting carbon nanotube segments. The carbon nanotube array 20 is an integrated structure being partly conductive and partly semiconductive. Thus, the carbon nanotube array 20 has a wide range of potential uses.

Figure 18:
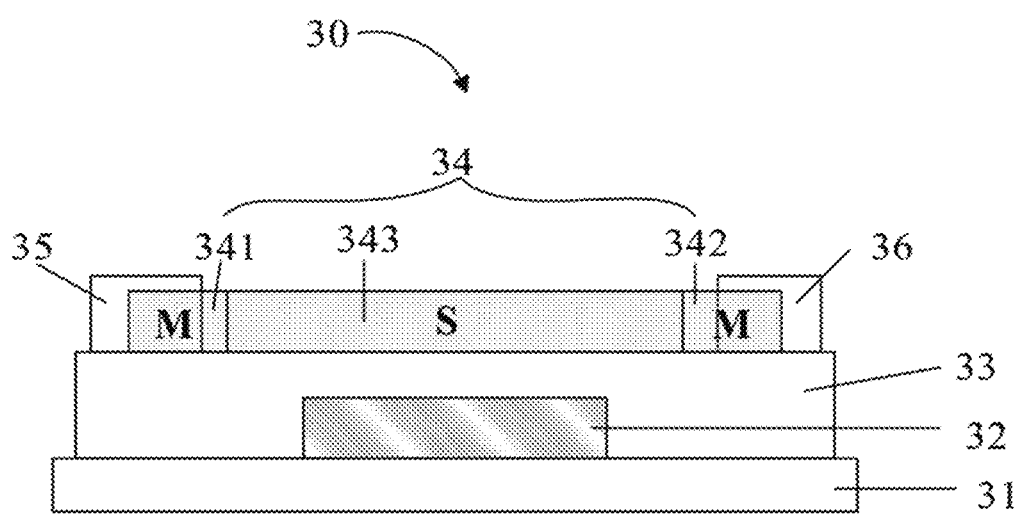
FIG. 18 is a structural schematic view of an embodiment of a thin film transistor.

For example, in FIG. 18, an embodiment of a thin film transistor 30 comprises an insulating substrate 31, a gate electrode 32, a gate insulating layer 33, a carbon nanotube structure 34, a source electrode 35, and a drain electrode 36. The carbon nanotube structure 34 includes at least one carbon nanotube. One end of the carbon nanotube is a first metallic carbon nanotube segment 341, and the other end of the carbon nanotube is a second metallic carbon nanotube segment 342. There is a semiconducting carbon nanotube segment 343 in the middle of the carbon nanotube. The gate electrode 32 is located on a surface of the insulating substrate 31. The gate insulating layer 33 is located on a surface of the gate electrode 32 away from the insulating substrate 31. The carbon nanotube structure 34 is located on a surface of the gate insulating layer 33 away from the gate electrode 32. The source electrode 35 is located on the first metallic carbon nanotube segment 341, and the drain electrode 36 is located on the second metallic carbon nanotube segment 342. The source electrode 35 and the drain electrode 36 are electrically connected to the carbon nanotube structure 34. The semiconducting carbon nanotube segment 343 is used as a channel. The carbon nanotube structure 34, the source electrode 35, and the drain electrode 36 are insulated from the gate electrode 32. Furthermore, the source electrode 35 and the drain electrode 36 are selectable, thus the first metallic carbon nanotube segment 341 can be used as a source electrode, and the second metallic carbon nanotube segment 342 can be used as a drain electrode.

The insulating substrate 31 is a support. Materials of the insulating substrate 31 can be rigid materials (e.g., glass, quartz, ceramics, diamond), or flexible materials (e.g., plastic or resin). The insulating substrate 31 can be polyethylene terephthalate, polyethylene naphthalate, or polyimide. In an embodiment, the material of the insulating substrate 31 is polyethylene naphthalate.

The gate electrode 32, the source electrode 35, and the drain electrode 36 are conductive materials. The conductive materials can be metal, indium tin oxide, antimony tin oxide, conductive silver paste, conductive polymer, and conductive carbon nanotubes. The material of the metal can be aluminum, copper, tungsten, molybdenum, gold, titanium, or palladium. In an embodiment, the gate electrode 32, the source electrode 35, and the drain electrode 36 are metal composite structures formed by gold and titanium, the gold being located on a surface of the titanium.

The material of the gate insulating layer 33 can be rigid materials, such as alumina, yttrium oxide, silicon nitride, or silicon oxide. The material of the gate insulating layer 33 can also be flexible materials, such as benzocyclobutene, polyester, or acrylic resin. A thickness of the gate insulating layer 33 is in a range of 0.5 nanometers to 100 micrometers. In an embodiment, the material of the gate insulating layer 33 is alumina, and the thickness of the gate insulating layer 33 is 40 nanometers.

The carbon nanotube structure 34 includes at least one carbon nanotube. When the carbon nanotube structure 34 includes a plurality of carbon nanotubes, the plurality of carbon nanotubes is combined tightly by the Van der Waals force to form a carbon nanotube film. The plurality of carbon nanotubes extends substantially along a same direction. Each of the carbon nanotubes consists of two metallic carbon nanotube segments and a semiconducting carbon nanotube segment in the middle of the carbon nanotube. The lengths of the metallic carbon nanotube segments of adjacent carbon nanotubes are substantially the same, and the lengths of the semiconducting carbon nanotube segments of adjacent carbon nanotubes are substantially the same. The metallic carbon nanotube segments of the plurality of carbon nanotubes are the ends of the carbon nanotubes. The metallic carbon nanotube segments at one end of the carbon nanotube structure 34 are in direct contact with the source electrode 35, and the metallic carbon nanotube segments at the other end of the carbon nanotube structure 34 are in direct contact with the drain electrode 36. Thus, the source electrode 35 and the drain electrode 36 have a good electrical connection within the carbon nanotube structure 34. The M-S-M type of the carbon nanotube structure 34 can be obtained by the above method. The lengths of the channel and the metallic carbon nanotube segments 341, 342 can be adjusted by controlling the electric field.

In use, the source electrode 35 is grounded. A voltage Vg is applied on the gate electrode 32. Another voltage Vd is applied to the drain electrode 36. The voltage Vg forms an electric field in the channel of the carbon nanotube structure 34. Accordingly, carriers exist in the channel near the gate electrode 32. As the voltage Vg increases, a current is generated and flows through the channel. Thus, the source electrode 35 and the drain electrode 36 are electrically connected.

Figure 19:
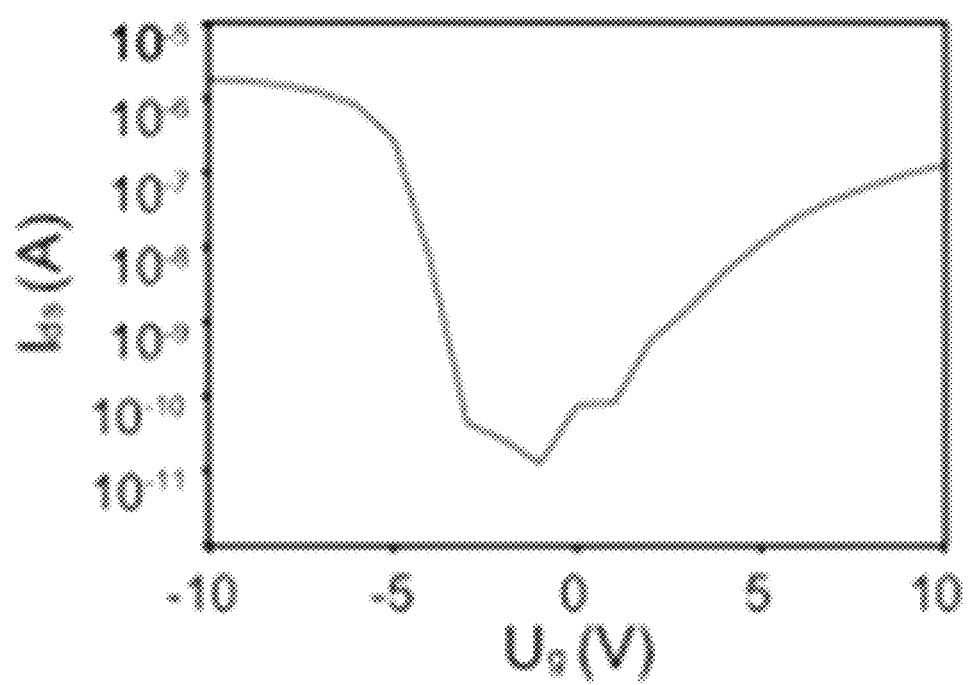
FIG. 19 is a chart showing test results in an embodiment of the thin film transistor.

In FIG. 19, a chart of test results of an embodiment of the thin film transistor 30 is shown. The carbon nanotube structure 34 of the thin film transistor 30 consists of forty carbon nanotubes. A switching ratio of the thin film transistor 30 can be $2 \times 10^5 : 1$.

The thin film transistor 30 has following advantages. The metallic carbon nanotube segments 341, 342 of the carbon nanotubes structure 34 can be used as source electrodes and drain electrodes. Thus, the structure of the thin film transistor is simple and there is no need to prepare extra electrodes. Since the source electrode, the drain electrode, and the semiconductor layer are integrated, the interface between the semiconductor layer and the source electrode, and the drain electrode is reduced as a barrier, and the switching ratio is increased. When an independent metal source electrode and an independent metal drain electrode are provided, both ends of the carbon nanotubes being metallic carbon nanotube segments, the metallic carbon nanotube segments have excellent electrical connection with the independent metal source electrode and the independent metal drain electrode.

Figure 20:
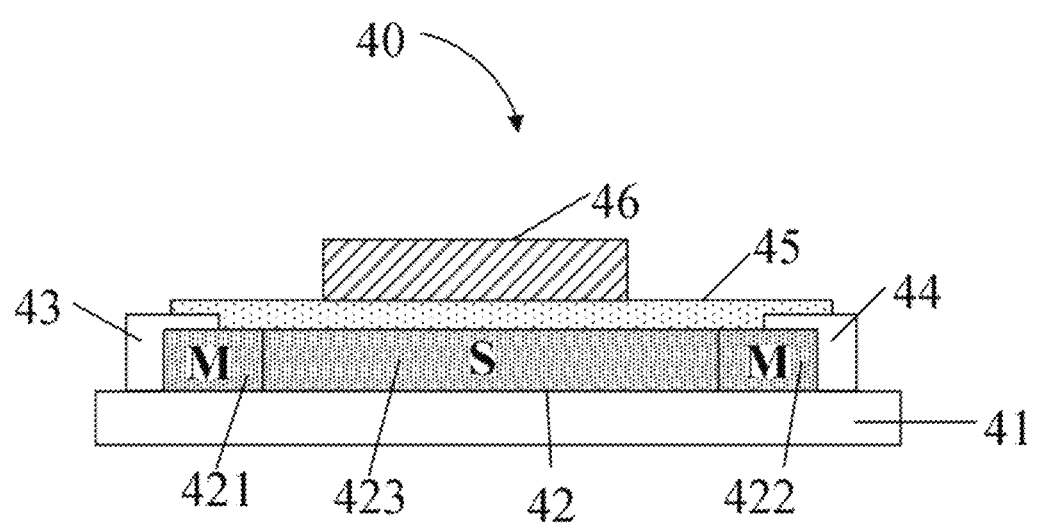
FIG. 20 is a structural schematic view of another embodiment of a thin film transistor.

In FIG. 20, an embodiment of a thin film transistor 40 comprises an insulating substrate 41, a carbon nanotube structure 42, a source electrode 43, a drain electrode 44, an insulating layer 45, and a gate electrode 46. The carbon nanotube structure 42 includes at least one carbon nanotube. One end of the carbon nanotube is a first metallic carbon nanotube segment 421, and the other end of the carbon nanotube is a second metallic carbon nanotube segment 422. A semiconducting carbon nanotube segment 423 is in the middle of the carbon nanotube. The semiconducting carbon nanotube segment 423 is used as a channel. The carbon nanotube structure 42 is located on a surface of the insulating substrate 41. The source electrode 43 is in direct contact with the first metallic carbon nanotube segment 421, and the drain electrode 44 is in direct contact with the second metallic carbon nanotube segment 422. The source electrode 43 and the drain electrode 44 are electrically connected to the carbon nanotube structure 42. The insulating layer 45 is located on a surface of the carbon nanotube structure 42. The gate electrode 46 is located on a surface of the insulating layer 45.

The thin film transistor 40 is similar to the thin film transistor 30 except that the thin film transistor 40 is a top gate type thin film transistor. The insulating layer 45 insulates the gate electrode 46 from the source electrode 43, the drain electrode 44, and the carbon nanotube structure 42.

Figure 21:
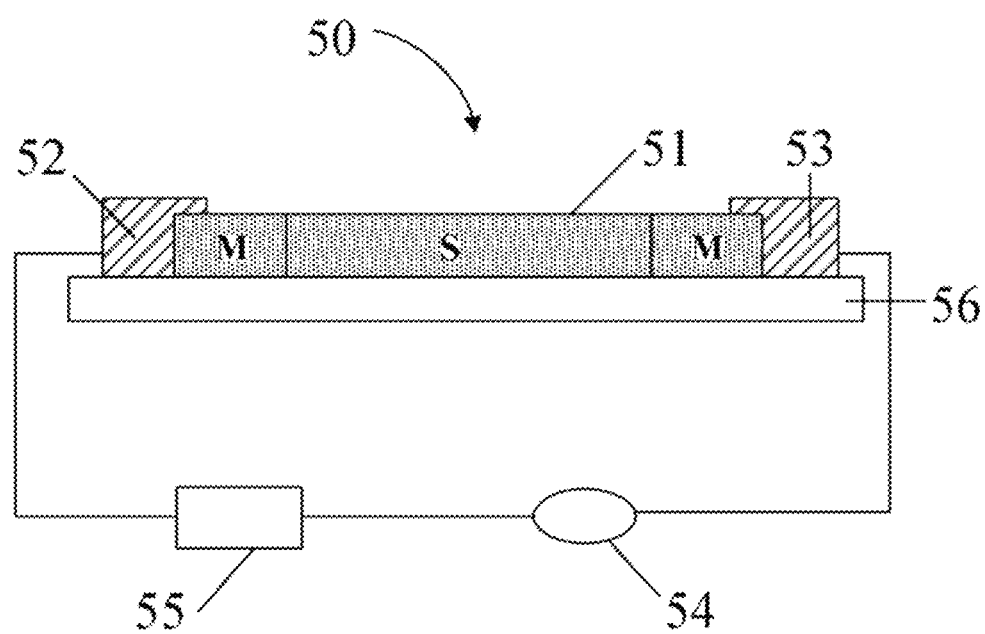
FIG. 21 is a structural schematic view of an embodiment of a light detector.

In FIG. 21, an embodiment of a light detector 50 comprises a carbon nanotube structure 51, a first electrode 52, a second electrode 53, and a current detection device 54. The carbon nanotube structure 51 is electrically connected to the first electrode 52 and the second electrode 53. The current detection device 54, the first electrode 52, the second electrode 53, and the carbon nanotube structure 51 are electrically connected to form a circuit in series. The carbon nanotube structure 51 is the same as the carbon nanotube structure 34. Both ends of the carbon nanotube structure 51 are metallic carbon nanotube segments, and the first electrode 52, the second electrode 53 are located on surfaces of the metallic carbon nanotube segments and in direct contact with the metallic carbon nanotube segments.

In the carbon nanotube structure 51, the M-S-M type of the carbon nanotube includes a heterojunction and is used to detect light.

The first electrode 52 and the second electrode 53 are both composed of conductive materials. The conductive materials can be metal, indium tin oxide, antimony tin oxide, conductive silver paste, conductive polymer, and conductive carbon nanotubes. The material of the metal can be aluminum, copper, tungsten, molybdenum, gold, titanium, or palladium. The first electrode 52 and the second electrode 53 can also be conductive films. A thickness of the conductive films is in a range of 2 microns to 100 microns. In an embodiment, the first electrode 52 and the second electrode 53 are metal composite structures formed of gold and titanium. The titanium is located on the carbon nanotube structure 51, and the gold is located on the titanium. A thickness of titanium is 2 nanometers, and a thickness of gold is 50 nanometers.

The current detection device 54 detects the current in the circuit. The current detection device 54 can be an ammeter. Furthermore, the light detector 50 includes a power source 55, the power source 55 can provide a bias voltage between the first electrode 52 and the second electrode 53.

Furthermore, the light detector 50 includes a substrate 56, the substrate 56 supporting the carbon nanotube structure 51. When the carbon nanotube structure 51 is a free-standing structure, the substrate 56 can be omitted. The term "free-standing structure" means that the carbon nanotube structure can sustain the weight of itself when hoisted by a portion thereof without any significant damage to its structural integrity. The material of the substrate 56 can be insulating material, such as glass, ceramic, polymer, or wood material. The material of the substrate 56 can also be conductive metal material coated with an insulating material. In an embodiment, the material of the substrate 56 can be glass.

The light detector 50 can detect light. The working process of the light detector 50 comprises turning on the power source 55, and applying a voltage between the first electrode 52 and the second electrode 53. In the absence of light, no photo-generated carriers are produced in the carbon nanotube structure 51, the heterojunction is on off-status, and no current passes through the series circuit. No current change is detected by the current detection device 54. If light irradiates the carbon nanotube structure 51, the photo-generated carriers are produced in the carbon nanotube structure 51, the heterojunction is on on-status, a current passes through the series circuit, and the current detection device 54 detects a current change.

The light detector 50 can be used quantitatively as well as qualitatively. For quantitative function, the light detector 50 turns on the power source 55 and applies a voltage between the first electrode 52 and the second electrode 53. As light of different strengths irradiates the carbon nanotube structure 51, different current values corresponding to the lights with different strengths are recorded, and a graph about the light strengths and the current values can be drawn. If light with unknown strength irradiates the carbon nanotube structure 51, a current value corresponding to such light can be detected, and according to the graph about the light strengths and the current values, the strength of the light can be calculated.

The light detector 50 has following advantages. Since a detection point of the light detector 50 is the carbon nanotube structure containing a heterojunction, the heterojunction is formed by the semiconducting carbon nanotube segments and the metallic carbon nanotube segments. The semiconducting carbon nanotube segments and the metallic carbon nanotube segments are integrated as a structure, which increases ease of conduction and sensitivity to current. Therefore, the light detector 50 has a simple structure and high sensitivity.

Figure 22:
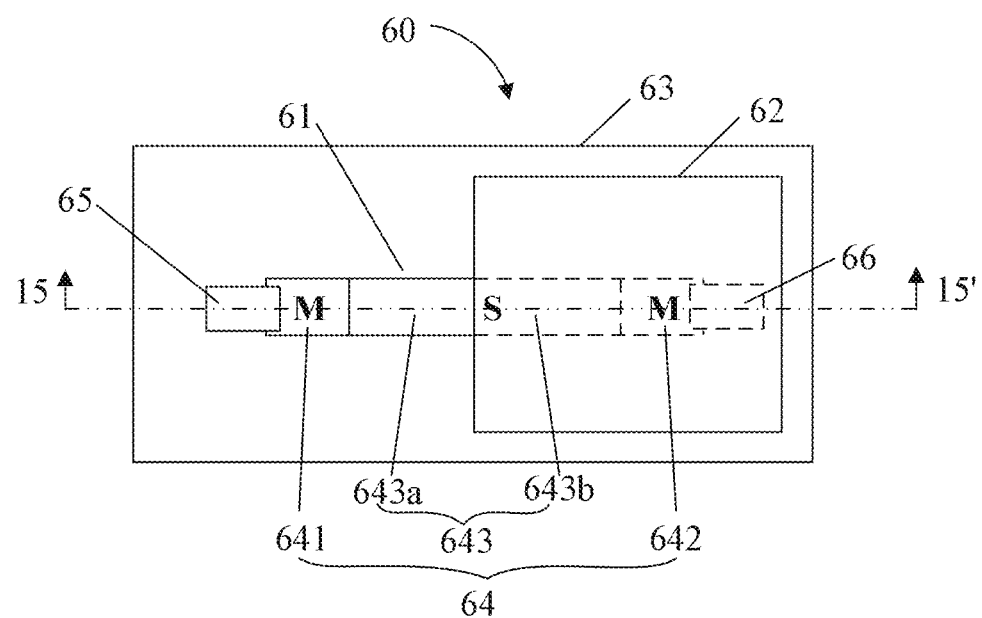
FIG. 22 is a structural schematic view of an embodiment of a photoelectric conversion device.
Figure 23:
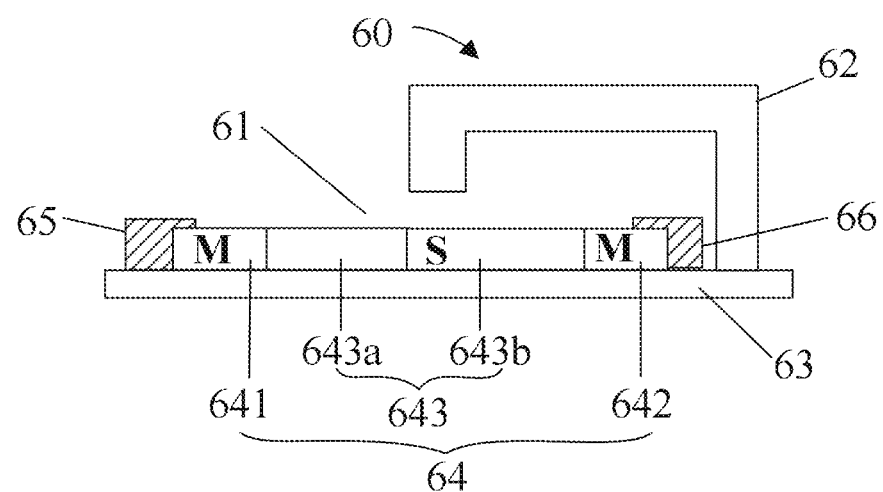
FIG. 23 is a sectional schematic view of another embodiment of the photoelectric conversion device.

In FIG. 22 and FIG. 23, an embodiment of a photoelectric conversion device 60 comprises a photoelectric conversion module 61, a cover structure 62, and a substrate 63. The photoelectric conversion module 61 is located on the substrate 63. The photoelectric conversion module 61 includes a carbon nanotube structure 64. The carbon nanotube structure 64 is the same as the carbon nanotube structure 34. One end of the carbon nanotube structure 64 is a first metallic carbon nanotube segment 641, the other end of the carbon nanotube structure 64 is a second metallic carbon nanotube segment 642, and a semiconducting carbon nanotube segment 643 is in the middle of the carbon nanotube. The semiconducting carbon nanotube segment 643 includes a covered area 643b and a non-covered area 643a. The cover structure 62 covers the covered area 643b of the photoelectric conversion module 61.

FIG. 22 shows a top view of the photoelectric conversion device 60. FIG. 23 shows a sectional schematic view of the photoelectric conversion device 60.

The substrate 63 supports the photoelectric conversion module 61. When the photoelectric conversion module 61 is a free-standing structure, the substrate 63 can be omitted. The material of the substrate 63 can be insulating material, such as glass, ceramic, polymer, or wood material. The material of the substrate 63 can also be conductive metal material coated with an insulating material. The material of the substrate 63 should not be infrared-absorbent. A thickness of the substrate 63 is not limited. The thickness of the substrate 63 is in a range of 1 millimeter to 2 centimeters. In an embodiment, the material of the substrate 63 is glass, and the thickness of the substrate 63 is 5 millimeters.

The semiconducting carbon nanotube segment 643 is divided into the covered area 643b and the non-covered area 643a. The areas of the covered area 643b and the non-covered area 643a is not limited. The area of the covered area 643b can be greater than, equal to, or less than the area of the non-covered area 643a. In an embodiment, the area of the covered area 643b is equal to the area of the non-covered area 643a.

The non-covered area 643a receives light energy and converts the light energy into heat energy, raising the temperature of the non-covered area 643a. Thus, a temperature difference is generated between the covered area 643b and the non-covered area 643a. A potential difference is generated in the semiconducting carbon nanotube segment 643 by the thermoelectric effect. The light energy can be from sunlight, visible light, infrared or ultraviolet, or even electromagnetic waves outside the visible spectrum.

The photoelectric conversion module 61 comprises a first electrode 65 and a second electrode 66. The first electrode 65 is electrically connected to the first metallic carbon nanotube segment 641, and the second electrode 66 is electrically connected to the second metallic carbon nanotube segment 642. The first electrode 65 and the second electrode 66 are voltage outputs of the photoelectric conversion device 60. Furthermore, the chirality of the first metallic carbon nanotube segment 641 and the second metallic carbon nanotube segment 642 are metallic. Thus, the first metallic carbon nanotube segment 641 and the second metallic carbon nanotube segment 642 can be independent electrodes, or the first metallic carbon nanotube segment 641 and the second metallic carbon nanotube segment 642 can be used as voltage outputs.

The photoelectric conversion device 60 further includes a first lead wire (not shown) and a second lead wire (not shown). The first lead wire is electrically connected to the first electrode 65, the second lead wire is electrically connected to the second electrode 66. The first lead wire can facilitate a connection to the first electrode 65 and the second lead wire can facilitate a connection to the second electrode 66, without a circuit.

The cover structure 62 is used to cover the covered area 643b of the photoelectric conversion module 61 to prevent light-irradiation of the covered area 643b. The cover structure 62 should not cover the non-covered area 643a. The material of the cover structure 62 can be conductive or insulating. The conductive material can be metal or alloy, such as stainless steel, carbon steel, copper, nickel, titanium, zinc, or aluminum. The insulating material can be resin or plastic. When the cover structure 62 is insulating material, the cover structure 62 can be in direct contact with the covered area 643b and cover the covered area 643b. When the cover structure 62 is conductive material, the cover structure 62 should be spaced apart and insulated from the covered area 643b. In an embodiment, the cover structure 62 is a housing with an accommodating space, and the cover structure 62 is fixed on the substrate 63. The covered area 643b is located inside the accommodating space of the cover structure 62. The covered area 643b is spaced from the cover structure 62. When the material of the substrate 63 and the material of the cover structure 62 are both insulating materials, the cover structure 62 and the substrate 63 can form an integrated structure.

The photoelectric conversion device 60 has following advantages. When the non-covered area 643a is exposed to light, a temperature difference is generated between the covered area 643b and the non-covered area 643a, electricity being generated by the thermoelectric effect. The semiconducting carbon nanotube segment 643, the first metallic carbon nanotube segment 641, and the second metallic carbon nanotube segment 642 are integrated, reducing the resistance of the interface as a barrier and increasing the output power.

Figure 24:
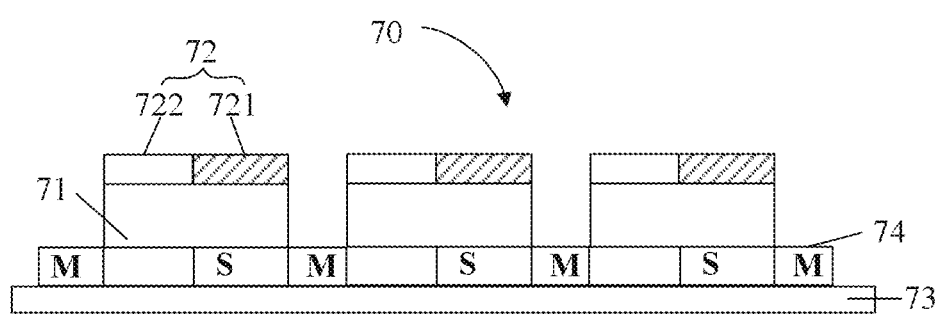
FIG. 24 is a structural schematic view of another embodiment of a photoelectric conversion device.

In FIG. 24, an embodiment of a photoelectric conversion device 70 comprises a photoelectric conversion module 71, a cover structure 72, and the substrate 73. The photoelectric conversion module 71 is located on the substrate 73. The photoelectric conversion module 71 includes a carbon nanotube structure 74. The carbon nanotube structure 74 comprises a plurality of metallic carbon nanotube segments and a plurality of semiconducting carbon nanotube segments alternately arranged.

The photoelectric conversion device 70 is similar to the photoelectric conversion device 60 except that the photoelectric conversion device 70 comprises the plurality of metallic carbon nanotube segments and the plurality of semiconducting carbon nanotube segments alternately arranged. Since the metallic carbon nanotube segments can be used as electrodes, the photoelectric conversion device 70 includes the plurality of semiconducting carbon nanotube segments connected in series. Thus, the output power of the photoelectric conversion device 70 is increased. The cover structure 72 includes a plurality of spaced covering bodies 721 and a plurality of spaced openings 722. Each of the plurality of semiconducting carbon nanotube segments has a first portion covered by one of the plurality of spaced covering bodies 721 and a second portion exposed from one of the plurality of spaced openings 722. The spaced openings can be windows using transparent materials, such as glass.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

Depending on the embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion for ordering the steps.

What is claimed is:

1. A method of making carbon nanotubes, the method comprising:
   depositing a catalyst layer on a substrate;
   placing the substrate having the catalyst layer thereon in a reaction furnace;
   heating the reaction furnace to a predetermined temperature;
   introducing a carbon source gas and a protective gas into the reaction furnace to grow a first carbon nanotube segment structure comprising a plurality of first metallic carbon nanotube segments;
   applying a pulsed electric field to grow a second carbon nanotube segment structure from the plurality of first metallic carbon nanotube segments, wherein the pulsed electric field is a periodic electric field comprising a plurality of positive electric field pulses and a plurality of negative electric field pulses alternately arranged, the second carbon nanotube segment structure comprises a plurality of semiconducting carbon nanotube segments, a direction of the plurality of positive electric field pulses is along a first direction in which the catalyst layer is positively charged, and a direction of the plurality of negative electric field pulses is along a second direction in which the catalyst layer is negatively charged.

2. The method as claimed in claim 1, wherein the plurality of first metallic carbon nanotube segments extends along a same direction.

3. The method as claimed in claim 1, wherein the plurality of first metallic carbon nanotube segments are single-walled carbon nanotube segments, and a diameter of the single-walled carbon nanotube segments is less than 2 nanometers.

4. The method as claimed in claim 3, wherein the diameter of the single-walled carbon nanotube segments is in a range of 1.2 nanometers to 1.5 nanometers.

5. The method as claimed in claim 1, wherein a quantity density of the plurality of first metallic carbon nanotube segments is greater than 3/μm.

6. The method as claimed in claim 1, wherein a quantity density of the plurality of first metallic carbon nanotube segments is greater than 6/μm.

7. The method as claimed in claim 1, wherein a Fermi level of the catalyst layer is raised by the plurality of positive electric field pulses to obtain a raised value, and the raised value is greater than or equal to 0.7 eV.

8. The method as claimed in claim 1, wherein a first pulse width of the negative electric field pulse is less than 200 ms, and only part of the second carbon nanotube segment structure are semiconducting carbon nanotube segments.

9. The method as claimed in claim 1, wherein a second pulse width of the negative electric field pulse is greater than 200 ms, and less than or equal to 500 ms, and all the second carbon nanotube segment structure are semiconducting carbon nanotube segments.

10. The method as claimed in claim 1, wherein a third pulse width of the negative electric field pulse is greater than 500 ms, the second carbon nanotube segment structure comprises a plurality of second metallic carbon nanotube segments and the plurality of semiconducting carbon nanotube segments alternately arranged.

11. A method of making carbon nanotubes, the method comprising:
growing a first carbon nanotube segment structure from a catalyst layer;
applying an electric field to the first carbon nanotube segment structure to charge the catalyst layer; and
reversing a direction of the electric field to grow a second carbon nanotube segment structure from the first carbon nanotube segment structure, wherein the first carbon nanotube segment structure and the second carbon nanotube segment structure have different chirality, the direction of the electric field is reversed from a positive direction to a negative direction, and the second carbon nanotube segment structure are semiconducting carbon nanotube segments; the direction of the electric field is reversed from the negative direction to the positive direction, and the second carbon nanotube segment structure are metallic carbon nanotube segments; and the positive direction is in which the catalyst layer is positively charged, and the negative direction is in which the catalyst layer is negatively charged.

* * * * *